United States Patent [19]

Majentny et al.

[11] Patent Number: 4,973,389

[45] Date of Patent: Nov. 27, 1990

[54] PROCESS FOR MAKING A HIGH TEMPERATURE-RESISTANT METAL LAYER ON A CERAMIC SURFACE

[75] Inventors: Klaus Majentny; Hermann-Josef Middeke; Elke Zakel, all of Berlin, Fed. Rep. of Germany

[73] Assignee: Schering Aktiengesellschaft, Berlin and Bergkamen, Fed. Rep. of Germany

[21] Appl. No.: 326,023

[22] Filed: Mar. 20, 1989

[30] Foreign Application Priority Data

Mar. 18, 1988 [DE] Fed. Rep. of Germany ....... 3809672

[51] Int. Cl.$^5$ .............................................. G25D 5/54
[52] U.S. Cl. .................................................. 204/58.5
[58] Field of Search ............................ 204/38.4, 58.5

[56] References Cited

U.S. PATENT DOCUMENTS

| 4,259,409 | 3/1981 | Arnold | 204/38.4 |
| 4,465,561 | 8/1984 | Nguyen | 204/58.5 |
| 4,721,656 | 1/1988 | Vance | 204/58.5 |

*Primary Examiner*—T. M. Tufariello
*Attorney, Agent, or Firm*—Michael J. Striker

[57] ABSTRACT

The process for making a high temperature-resistant metal layer on a ceramic surface includes the step of depositing the metal layer electrochemically from an electrochemical bath containing at least one metal salt containing the metal to be deposited, advantageously a metal salt of a resin acid, and a conductivity raising substance, e.g. methane sulfonic acid, dissolved in an organic solvent containing polar groups and having less than 1% by weight water. The resultant product is bubble-free and stable to high temperature.

9 Claims, No Drawings

PROCESS FOR MAKING A HIGH TEMPERATURE-RESISTANT METAL LAYER ON A CERAMIC SURFACE

BACKGROUND OF THE INVENTION

My invention relates to a process or method of making a high temperature-resistant metal layer on a ceramic surface, especially to a process for making a bubble-free metal layer on a ceramic surface by electrochemical metal deposition.

Electrochemical metal deposition on a ceramic surface is already known.

The disadvantage of the current process is that a metal layer with the customary electrochemical deposition bath only tolerates temperatures up to a maximum of 300° C. Bubbles which interrupt and break the continuous ceramic-metal bond form above this temperature. The origin of this bubble formation is not known for certain but may be related to the formation of gas at higher temperatures in the deposited layer.

SUMMARY OF THE INVENTION

It is an object of the present invention to provide an improved process for making a high temperature-resistant metal layer, especially a bubble free metal layer, on a ceramic surface.

In keeping with these objects and with others which will become apparent hereinafter, in a process for making a high temperature-resistant metal layer on a ceramic surface by electrochemical deposition in which a water-free or water-poor electrochemical bath is used.

By "water-poor or water-free" electrochemical bath we mean a bath which does not contain water or which contains less than about one percent by weight of water.

DESCRIPTION OF PREFERRED EMBODIMENTS

There are many possible embodiments of our invention. The electrochemical bath may comprise an organic solvent. Furthermore this solvent may contain polar groups or form D-complexes.

Accordingly the solvents according to our invention maybe of a variety of conventional organic solvents including ethanol, i-propanol, n-butanol, diethylether, tetrahydrofuran, diethyleneglycol ether, toluene, xylene, N,N-dimethylformamide, N-methyl pyrrolidone and acetylacetone.

Advantageously the water content of the solvent is less than 1% by weight.

The electrochemical bath can contain metal compound of any of a variety of metals including lead, cadmium, iron, gold, cobalt, copper, nickel, palladium platinum, zinc, tin and rhodium. The metal of the electrochemical bath is advantageously combined in a metal compound comprising a salt of an organic or inorganic acid. The concentration of this bath solution amounts to from about 0.10 to 150 g/liter in relation to metal.

Our invention also includes the product of the above-described process of our invention, i.e. the ceramic substrate with the high temperature-resistant metal layer.

The metal layers deposited on ceramic surfaces according to our invention are surprisingly stable up to temperatures of 500° C. and are more resistant and show no bubble formation, which is of extraordinarily advantage in electronic applications, e.g. in circuit boards.

As substrates commercially available ceramics of several different kinds can be used including aluminum oxide, aluminum nitride, beryllium oxide or barium titanate ceramics. These are pretreated in a conventional way which calls for a thin metal layer, advantageously copper. Also Nickel, Cobalt or Gold are usable as base metals.

The bath according to our invention contains the following standard components:

an organic solvent, which advantageously contains —CO—NH—, —CO— or —O— or forms complexes, including for example alcohols such as ethanol, i-propanol or n-butanol or ethers such as diethyl ether, tetrahydrofuran or diethylene glycol ether, or aromatic hydrocarbons such as toluene or xylene or N,N-dimethyl formamide, N-methyl pyrrolidone or acetylacetone;

one or more compounds of metals including lead, cadmium, chromium, iron, gold, cobalt, copper, nickel, palladium, platinum, zinc, tin, rhodium in the form of compounds such as sulfate, sulfonate, halide, nitrate or as salts of an organic acid such as acetic or succinic acid, or as metal complexes with complex formation such as acetylacetonate, acetacetate or tetrahydrofuran. Advantageously materials are used such as resinate. They can also be the metal salts of resin acids, tricyclic, aliphatic, unsaturated monocarboxylic acids such as Levopimaric acid, neoabietic acid, palustrin acid, abietic acid, dehydroabietic acid, tetrahydroabietic acid, pimaric acid or isopimaric acid(the metal content of the bath is advantageously from 0.10 to 150 g/liter based on the metal concentration);

a substance which raises the conductivity such as an acid, a basic compound or a conductive salt including Lewis acids such as $AlCl_3$ or $BF_3$ or Lewis bases or proton donating acids such as concentrated sulfuric acids or methane sulfonic acid or quaternary ammonium compounds such as tetrabutyl ammonium tetrafluoroborate(the concentration of these substances should be from about 0.5 to 350 g/liter of bath solution; and one or more auxiliary substances which influence the structure of the electrochemically deposited layer to provide a high gloss, imperviousness or ductility(for this purpose surface active substances including redoxsystems and Tenside can be used).

The operating conditions of the electrochemical bath of our invention are as follows:

Current density: 0.2–3.0 $A/dm^2$, advantageously 1.0–2.5 $A/dm^2$.

Operating temperature: 20° C.–60° C., advantageously 25°–35° C.

The metallized ceramic workpiece made by the process of our invention is especially useful in the electronic industry and electronics.

The following detailed examples are illustrative of our invention.

EXAMPLES

EXAMPLE 1

35 g of the copper salts of a resin acid, 35 g methane sulfonic acid and 17 g tetrabutyl ammonium tetrafluoroborate, are dissolved in 600 g of N,N-dimethylformamide(DMF) and then diluted with DMF to one liter. Electrolytic copper is used as an anode material. A pure, fine crystalline, silky unpolished copper coating results with an average current density of 1.0 $A/dm^2$.

The cathodic current yield amounts to about 89% with a working temperature of 25° C. to 55° C.

EXAMPLE 2

50 g of copper salt of a resin acid, 10 g of tetrabutyl ammonium tetrafluoroborate, 50 g methane sulfonic acid and 600 g of acetylacetone( 99%) are mixed and diluted with acetylacetone to one liter. Electrolytic copper is used as an anode material. Copper can be used with a content of about 0.05% phosphorous. The current density used amounts to 0.2 to 1.5 A/dm$^2$, advantageously 1.0 A/dm$^2$. The working temperature varies from 25° to 60° C., advantageously 35° C.

EXAMPLE 3

A nickel salt of a resin acid 150 g, methane sulfonic acid 60 g, N,N-dimethylformamide 600 g and amidosulfuric acid 15 g are dissolved and then are diluted to one liter with DMF(dimethylformamide). Electrolytic nickel is used as an anode material. The average current density amounts to about 2.5 A/dm$^2$. The working temperature is about 40° C. The cathodic current yield amounts to about 98%. The deposits bright gray and are silky with very fine structure.

EXAMPLE 4

Copper acetylacetonate 80 g, methane sulfonic acid 150 g and N,N-dimethylformamide 850 are mixed and diluted with dimethylformamide to one liter. Electrolytic copper is used as an anode material. The usable current density amounts to 0.5 to 1.0 A/dm$^2$ with a working temperature of from 25° to 50°.

EXAMPLE 5

A 2×2 inch plate of aluminum oxide is activated a known way with alkali and coated with an approximately 3 micrometer thick copper layer. After that the plate is either dried by blowing or the water is removed by washing with ethanol. Subsequently the copper layer on the plate is reinforced electrochemically to a thickness of 15 micrometers of copper in a bath made from N,N dimethylformamide, copper sulfate and sulfuric acid with 2 A/dm$^2$ in 30 minutes. The plate is heated in 12 minutes to 50° C. under a protective gas(argon with about 2% hydrogen content), left at this temperature for about 30 minutes and then is cooled again to room temperature in 30 minutes. The metal surface undergoes no chemical changes nor experiences damage. A ceramic plate which is treated in the same way but in a watery electrochemical media shows bubble formation.

EXAMPLE 6

A ceramic plate made of aluminum nitride, which was metallized and covered in the same way as in Example 5, was strengthened electrochemically in a nickel bath, which comprises the nickel salt of a resin acid, N,N-dimethylformamide and methane sulfonic acid. In 30 minutes a nickel layer of 25 micrometers thickness was deposited on the surface with a current density of 2 A/dm$^2$. A nickel layer of 23 micrometers was deposited on the copper in a watery galvanic bath in parallel with that. After tempering at 500° C. under a protective gas the nickel layer produced in the watery medium showed large bubbling, while the layer deposited from the dimethylformamide bath should no imperfections. A metallographic cross section through the ceramic copper nickel compound showed the undamaged compound. In contrast the nickel from the watery bath after tempering showed a large amount of tears and loosening of copper from the ceramic.

EXAMPLE 7

A copper pretreated aluminum oxide plate was covered with Nickel electrochemically in a bath which was made from one liter of N-methylpyrrolidone, 50 g of nickel salt of a resin acid and 20 ml of concentrated sulfuric acid. The bright green solution produces a glossy good adhering nickel layer with a current density of 0.8 A/dm$^2$, which is stable up to temperatures of 500° C.

EXAMPLE 8

A copper pretreated AlN plate was coated with nickel in a bath made of 50 ml methane sulfonic acid and 75 g of nickel salt of a resin acid in 500 ml of ethanol with a current density of 2 A/dm$^2$ to a layer thickness of 30 micrometers of nickel. The nickel layer is unchanged up to temperatures of 550°.

While the invention has been illustrated and described as embodied in a process for making a high temperature-resistant metal layer on a ceramic structure and product thereof, it is not intended to be limited to the details shown, since various modifications and chemical changes may be made without departing in any way from the spirit of the present invention.

Without further analysis, the foregoing will so fully reveal the gist of the present invention that others can, by applying current knowledge, readily adapt it for various applications without omitting features that, from the standpoint of the prior art, fairly constitute essential characteristics of the generic or specific aspects of this invention.

What is claimed as new and desired to be protected by Letters Patent is set forth in the appended claims:

1. A process for making a high temperature-resistant, especially bubble-free, metal layer on a ceramic surface comprising the step of electrochemically depositing said metal layer from an electrochemical bath containing an organic solvent with at least one polar group and at least one metal salt, said solvent having a water content less than 1% by weight.

2. A process according to claim 1 in which said organic solvent forms D-complexes.

3. A process according to claim 1, in which said organic solvent is a member selected from the group consisting of ethanol, i-propanol, n-butanol, diethylether, tetrahydrofuran, diethyleneglycol ether N,N-dimethylformamide, N-methyl pyrrolidone and acethylacetone.

4. A process according to claim 1 in which from about 0.1 to 150 g/l of said metal salt is present in said electrhochemical bath.

5. A ceramic substrate with a high-temperature metal layer made by said process as defined in claim 1.

6. A process according to claim 1, wherein said metal salt contains a metal selected from the group consisting of lead, cadmium, iron, gold cobalt, copper, nickel, palladium, platinum, zinc, tin and rhodium.

7. A process according to claim 1, wherein said metal salt is a salt of resin acid selected from the group consisting of pimaric acid, neoabietic acid, palustrin acid, abietic acid, dehydroabietic acid, tetrahydroabietic acid and isopimaric acid.

8. A process according to claim 1, wherein said electrochemical bath also contains a conductivity increasing substance.

9. A process according to claim 8, wherein said conductivity increasing substance is methane sulfonic acid.

* * * * *